United States Patent
Gephart et al.

(10) Patent No.: US 9,827,584 B2
(45) Date of Patent: Nov. 28, 2017

(54) SELF-CENTERING MAGNETIC MASKING SYSTEM

(71) Applicant: WKI Holding Company, Inc., Rosemont, IL (US)

(72) Inventors: John Gephart, Corning, NY (US); Richard Lugen, Painted Post, NY (US)

(73) Assignee: WKI Holding Company, Inc., Rosemont, IL (US)

( * ) Notice: Subject to any disclaimer, the term of this patent is extended or adjusted under 35 U.S.C. 154(b) by 0 days.

(21) Appl. No.: 15/417,167

(22) Filed: Jan. 26, 2017

(65) Prior Publication Data
US 2017/0203317 A1    Jul. 20, 2017

Related U.S. Application Data

(62) Division of application No. 13/755,878, filed on Jan. 31, 2013, now Pat. No. 9,579,680.

(51) Int. Cl.
| | |
|---|---|
| *B28B 11/00* | (2006.01) |
| *B05B 13/02* | (2006.01) |
| *B05B 15/04* | (2006.01) |
| *B05C 21/00* | (2006.01) |
| *B02C 13/02* | (2006.01) |
| *C23C 14/04* | (2006.01) |
| *C23C 16/04* | (2006.01) |
| *B05C 13/02* | (2006.01) |
| *B05D 1/32* | (2006.01) |
| *B28B 11/04* | (2006.01) |
| *B41F 17/00* | (2006.01) |

(52) U.S. Cl.
CPC ........ *B05B 15/045* (2013.01); *B05B 13/0228* (2013.01); *B05C 13/02* (2013.01); *B05C 21/005* (2013.01); *B05D 1/32* (2013.01); *B28B 11/001* (2013.01); *B28B 11/04* (2013.01); *B41F 17/006* (2013.01)

(58) Field of Classification Search
None
See application file for complete search history.

(56) References Cited

U.S. PATENT DOCUMENTS

| | | |
|---|---|---|
| 1,642,607 A | 9/1927 | Fordyce |
| 2,358,258 A | 9/1944 | Schweitzer |
| 2,426,391 A | 8/1947 | Emerson |
| 2,874,676 A | 2/1959 | Fournier |

(Continued)

*Primary Examiner* — Binu Thomas
(74) *Attorney, Agent, or Firm* — McDermott Will & Emery LLP

(57) ABSTRACT

A masking fixture for coating dishware includes a support base having a first ferromagnetic member and a contoured support surface configured for engagement with a lower contour of the dishware. A mask base includes a second ferromagnetic member. The second ferromagnetic member is magnetically attracted to the first ferromagnetic member. The mask base includes a mask guide. A mask includes a masking surface configured for engagement with the upper contour. The mask is moveably coupled to the mask guide for movement between an engaged position in which the masking surface is engageable with the upper contour and a disengaged position. The mask can be moved to the disengaged position to facilitate removal of the mask base from the dishware after a coating operation.

5 Claims, 4 Drawing Sheets

(56) References Cited

U.S. PATENT DOCUMENTS

| | | | |
|---|---|---|---|
| 2,883,960 A | | 4/1959 | Way et al. |
| 3,868,901 A | | 3/1975 | Valiela |
| 3,871,293 A | | 3/1975 | Valiela |
| 3,885,522 A | | 5/1975 | MacDonald et al. |
| 4,202,290 A | | 5/1980 | Hatfield |
| 4,265,002 A | * | 5/1981 | Hosken .................. A41F 1/002 24/303 |
| 4,599,970 A | | 7/1986 | Peterson |
| 4,735,701 A | | 4/1988 | Allen et al. |
| 5,354,380 A | | 10/1994 | Zejda |
| 5,503,675 A | | 4/1996 | Zejda |
| 6,135,050 A | | 10/2000 | Inaba et al. |
| 6,361,640 B1 | | 3/2002 | Kamen et al. |
| 6,776,887 B2 | | 8/2004 | Roberts et al. |
| 9,579,680 B2 | | 2/2017 | Gephart et al. |
| 2003/0185978 A1 | * | 10/2003 | Roberts .................. C23C 14/50 427/248.1 |
| 2006/0258030 A1 | * | 11/2006 | Koeda .................. C23C 14/042 118/715 |
| 2007/0006807 A1 | * | 1/2007 | Manz .................. C23C 14/042 118/720 |
| 2014/0212586 A1 | | 7/2014 | Gephart et al. |

\* cited by examiner

SELF-CENTERING MAGNETIC MASKING SYSTEM

CROSS-REFERENCE TO RELATED APPLICATIONS

This application is a divisional of U.S. application Ser. No. 13/755,878, filed Jan. 31, 2013, which is incorporated herein by reference in its entirety.

TECHNICAL FIELD

The present disclosure generally relates to a system for masking contoured objects for the application of coatings, and more particularly to a system for masking disk-like objects, such as kitchen ware, for the application of paints or glazes.

BACKGROUND

Kitchen ware, such as bake ware, tableware, dinner ware, service ware, and the like are provided in a wide variety of colors and patterns. Although various materials can be used, much kitchen ware is formed of ceramic materials. As a result, it can be difficult from a manufacturing perspective to precisely control the dimensions of the various curves, radii, and the like that define the overall contour of the plate. This relative lack of dimensional stability of the kitchen ware poses challenges for the high-volume manufacturer kitchen ware, particularly with respect to the application of colors and patterns to the kitchen ware during the manufacturing process. For example, it can be difficult to precisely and repeatably fixture multiple samples of a given piece of kitchen ware for the application of paint or other coatings because there may relatively large dimensional variations from sample to sample.

SUMMARY

According to some aspects, a masking fixture is provided for coating dishware. The dishware has an upper contour and a lower contour. The fixture includes a support base having a first ferromagnetic member. The support base also includes a contoured support surface configured for engagement with the lower contour. A mask base includes a second ferromagnetic member. The second ferromagnetic member is magnetically attracted to the first ferromagnetic member. The mask base includes a mask guide. A mask includes a masking surface configured for engagement with the upper contour. The mask is moveably coupled to the mask guide for movement between an engaged position in which the masking surface is engageable with the upper contour and a disengaged position.

According to other aspects a masking fixture is provided for coating dishware. The dishware has a lower contour. The fixture includes a support base having a contoured support surface substantially corresponding to the lower contour. The support base also includes a ferromagnetic member positioned adjacent the support surface. A mask base is magnetically attracted to the ferromagnetic member. The mask base includes an elongated guide member that defines a guide axis. A mask includes a masking profile defined by a masking surface. The mask is slidably coupled to the elongated guide member for movement along the guide axis between a lowered position for performing a coating operation and a raised position for facilitating removal of the mask and the mask base from the support base by overcoming the magnetic attraction between the ferromagnetic member and the mask base.

According to still other aspects, a method is provided for applying a coating to dishware. The method includes positioning a first side of the dishware on a support surface of a support base. The support base includes at least one ferromagnetic member positioned adjacent the support surface. A mask base that is magnetically attracted to the ferromagnetic member is positioned against a second side of the dishware. The magnetic attraction between the ferromagnetic member and the mask base substantially clamps the dishware between the support surface and the mask base. A mask is engaged with the second side of the dishware. The mask is moveably mounted to the mask base and includes a masking surface that defines a masking profile. With the mask engaged with the second side of the dishware, a coating is applied to the second side of the dishware. After applying the coating, the mask is moved with respect to the mask base to disengage the mask from the second surface. With the mask disengaged from the second surface, a force is applied to at least one of the mask and the mask base to overcome the magnetic attraction between the ferromagnetic member and the mask base, and to thereby disengage the mask base from the second side of the dishware.

The present disclosures generally relate to a masking fixture for use in applying coatings to disk-like contoured objects. In particular, a magnetic masking system is provided for the application of coatings to kitchen ware or dishware. Features, advantages and embodiments of the magnetic masking system may be set forth, or are apparent, from consideration of the following description. Moreover, it is to be understood that the following description is exemplary and intended to provide further explanation without limiting the scope of the invention as claimed.

BRIEF DESCRIPTION OF THE DRAWINGS

To understand the present disclosure, it will now be described by way of example, with reference to the accompanying drawings in which embodiments of the disclosures are illustrated and, together with the descriptions below, serve to explain the principles of the disclosure.

Figure 1:
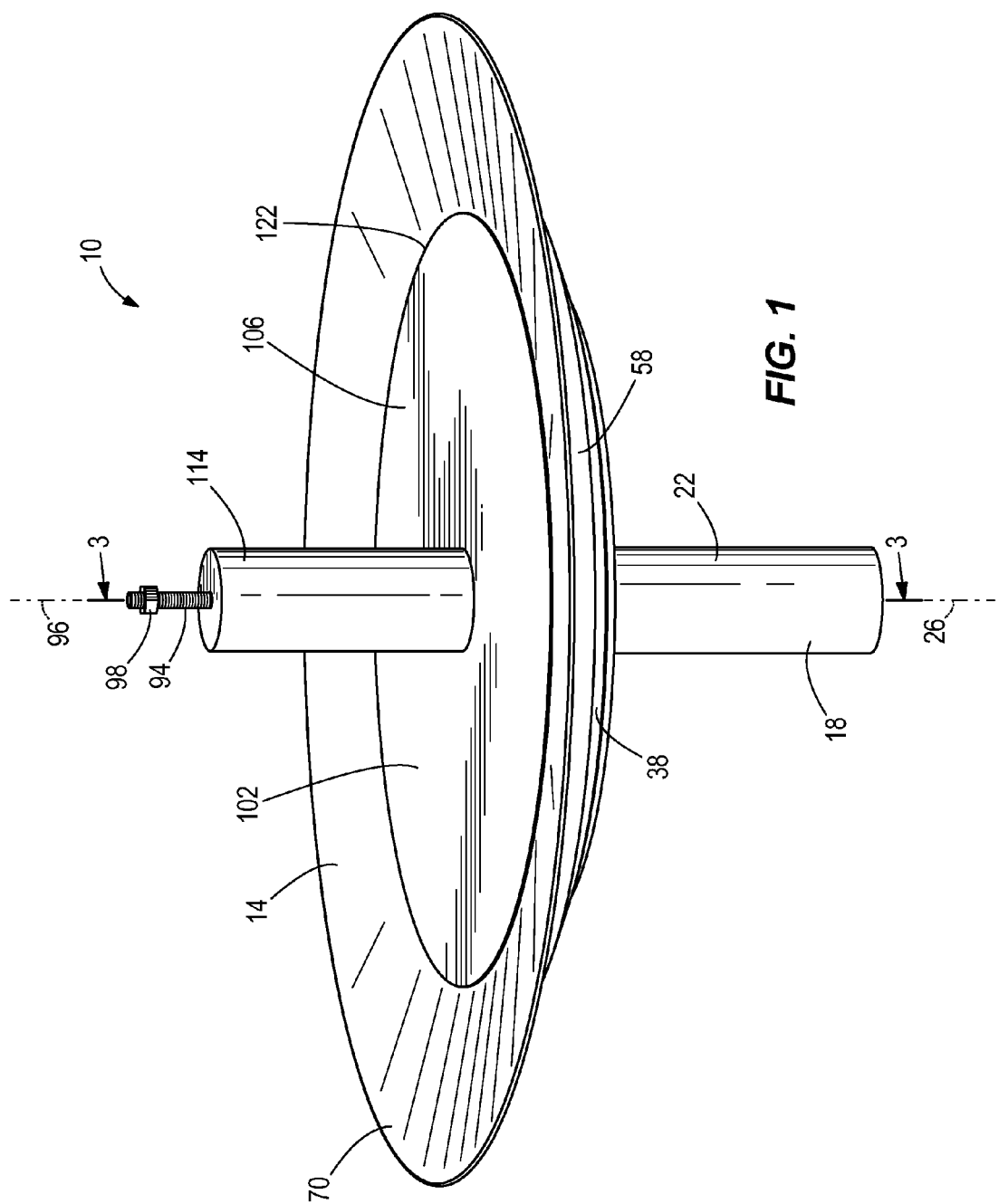
FIG. 1 is a perspective view of a masking system according to one embodiment.

The components in the drawings are not necessarily to scale, emphasis instead being placed upon clearly illustrating the principles of the present disclosure.

DETAILED DESCRIPTION

While the masking system discussed herein is susceptible of embodiments in many different forms, there is shown in the drawings, and will herein be described in detail, exemplary embodiments with the understanding that the present description is to be considered as an exemplification of the principles of the masking system and is not intended to limit the subject matter of the masking system to the embodiments illustrated.

FIGS. 1-4 illustrate a masking fixture 10 for the application of a coating to an object 14. In the illustrated configuration, the object 14 is a piece of ware, such as a dinner plate, however the structure, function, and operation of the masking fixture 10 can be applied to a wide variety of objects. As discussed further below, the masking fixture 10 may be "self-centering" and in that regard may be well suited for holding and securing generally circular objects having features, such as surface contours, that are arranged in a generally concentric manner, like the exemplary dinner plate 14 shown in the Figures.

Figure 2:
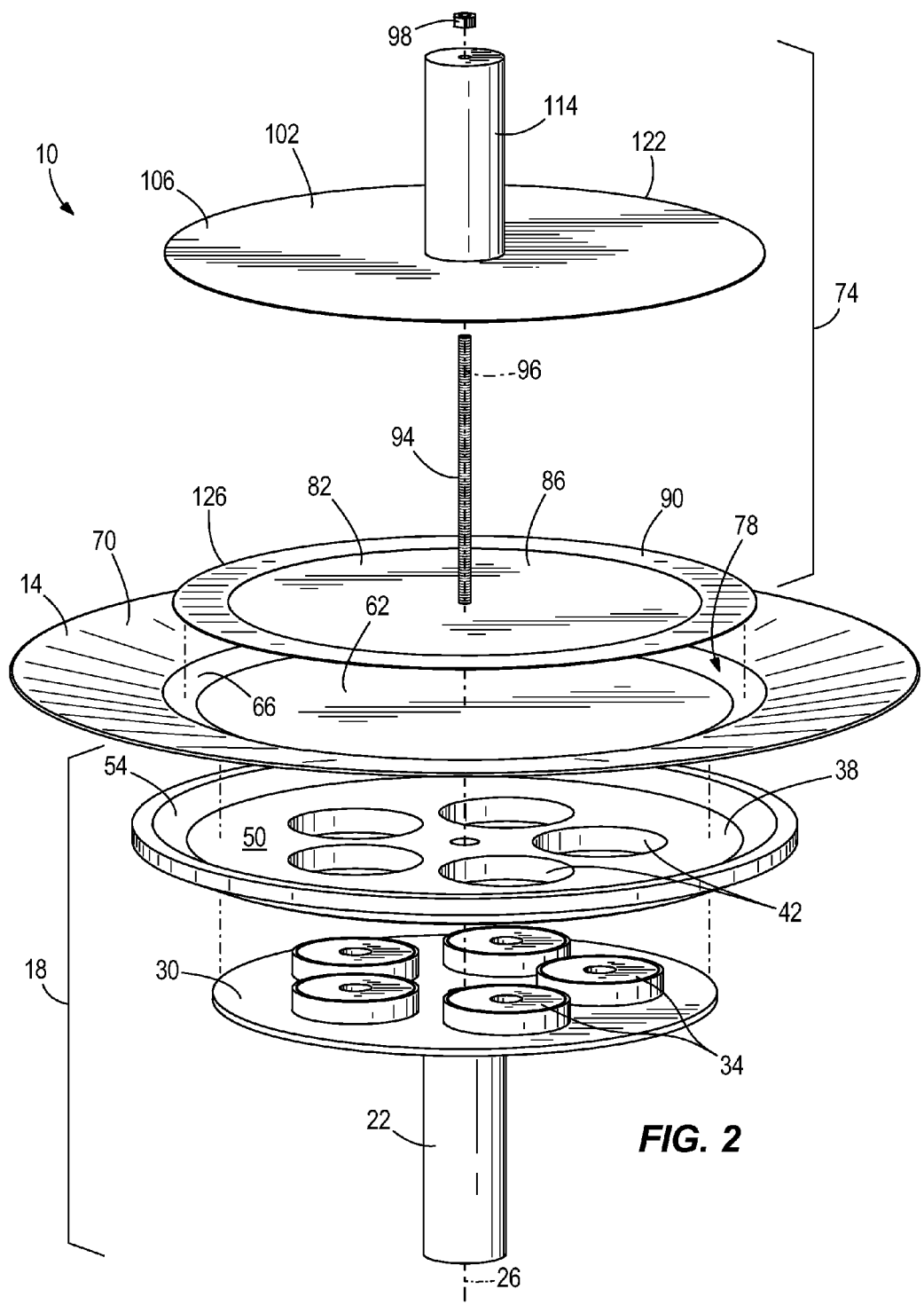
FIG. 2 is a partially exploded perspective view of the masking system of FIG. 1.
Figure 3:
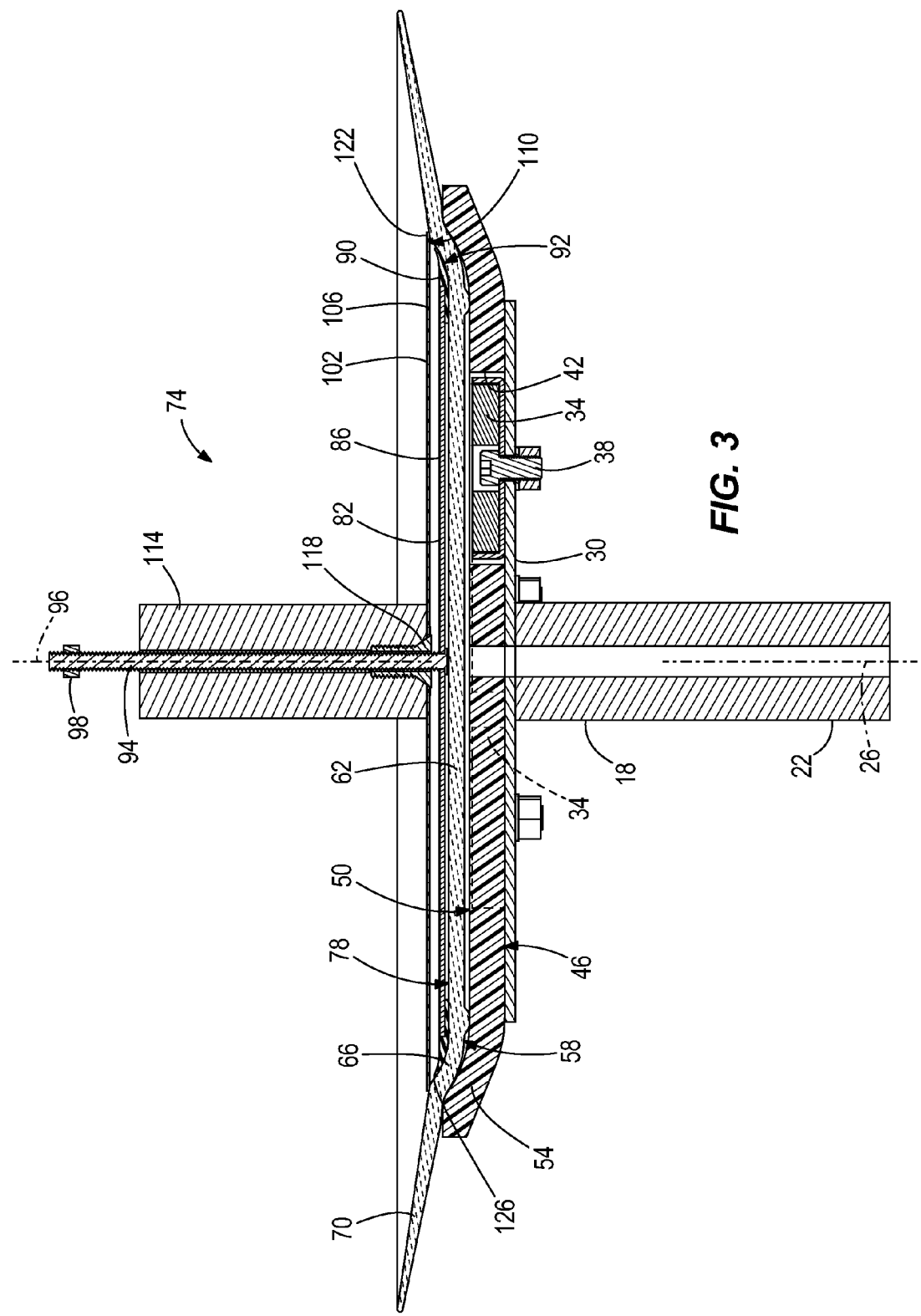
FIG. 3 is section view taken along line 3-3 of FIG. 1.

Referring initially to FIGS. 1-3, the fixture 10 includes a support base 18 including a generally cylindrical support post 22 defining a central axis 26. The support post 22 may be configured for mounting to other structure, such as a rotary drive mechanism, for rotating the masking fixture 10. A support plate 30 is mounted to one end of the support post 22 and is substantially axially aligned therewith. The support base 18 also includes a plurality of first ferromagnetic members 34 coupled to the support plate 30. In the illustrated embodiment, the support base 18 includes five substantially cylindrical, puck-shaped first ferromagnetic members 34 circumferentially spaced around the central axis 26. Other embodiments of the fixture 10 may include more or fewer first ferromagnetic members 34 in different arrangements, depending on the particular application. The first ferromagnetic members 34 may be coupled to the support plate 30 by fasteners 38, as shown in FIG. 3, or may be coupled to the support plate 30 in another suitable manner, such as by adhesives or the like.

The support base 18 also includes a support portion that in the illustrated embodiment is in the form of a support disk 38. The support disk 38 is supported by the support plate 30 and is configured to fit over and around the first ferromagnetic members 34. Thus, in the illustrated configuration, the support disk 38 is provided with five substantially circular through openings 42 positioned to receive the first ferromagnetic members 34. In other configurations having a different arrangement of first ferromagnetic members 34, the support disk 38 will have a different configuration and arrangement of openings to accommodate the different arrangement of first ferromagnetic members 34.

The support disk 38 includes a substantially flat bottom surface 46 that rests upon or that may be coupled to the support plate 30. The support disk 38 also includes a contoured support surface 50 opposite the bottom surface 46. In the illustrated configuration, the support surface 50 includes a generally concave and upwardly extending outer rim portion 54. The support disk 38 and, more specifically, the contoured support surface 50, is configured to support the object 14. More specifically, the contoured support surface 50, including the outer rim portion 54, is configured to correspond to a lower contour 58 of the object 14. For example, the exemplary object 14 includes a relatively flat central portion 62, an upwardly curved transition portion 66, and an outwardly and slightly upwardly extending outer portion 70. The support surface 50 therefore includes a relatively flat central portion, and the concave outer rim portion 54 extends upwardly and outwardly to engage and support the object in the vicinity of the transition portion 66 and the outer portion 70. As shown, while the support surface 50 is contoured to correspond to the general configuration of the lower contour 58 of the object 14, the support surface 50 does not necessarily correspond to each and every feature of the lower contour 58 of the object 14. The configuration of the support surface 50 is such that when the object 14 is placed on the support disk 38, the object 14 "self-centers" with respect to the central axis 26. Stated another way, gravity acting on the object 14 tends to pull the object 14 into a substantially centered, substantially coaxial relationship with respect to the support disk 38.

The support disk 38 preferably is formed of a rigid yet non-marring material, such as a suitable plastic. As shown in FIG. 3, the support disk 38 also has a thickness that is slightly greater than a height of the first ferromagnetic members 34, thereby preventing direct contact between the first ferromagnetic members 34 and the object 14. In some implementations, the support disk 38, and more particularly the outer rim portion 54 of the support disk 38, may be formed by taking an imprint of the lower contour 58 of the object 14 and forming the support surface 50 based on the imprint.

The masking fixture 10 also includes a masking assembly 74 that is releasably engageable with an upper contour 78 of the object 14. The masking assembly 74 includes a mask base 82 that is magnetically attracted to the first ferromagnetic members 34. In the illustrated configuration, the mask base 82 includes a central plate portion 86 formed of a ferromagnetic material, and an outer engagement member 90 formed of a non-ferromagnetic material, such as urethane. The engagement member 90 may be formed of a non-marring material that holds its shape but is able to accommodate slight variations in the upper contours 78 of the objects 14.

The engagement member 90 includes a lower engagement surface 92 configured to conform to the upper contour 78 of the object 14. In this regard, the engagement member 90 may be formed by taking a mold or imprint of the upper contour 78 of the object 14 and forming the lower engagement surface 92 based on the mold or imprint. The engagement member 90 prevents substantial direct contact between the central plate portion 86 and the object 14. In the illustrated construction this is achieved by molding the engagement member 90 around the outer circumference of the central plate portion 86. In other embodiments, the engagement member 90 may comprise several engagement members spaced or otherwise distributed around or along the central plate portion 86 in a manner that prevents substantial direct contact between the central plate portion 86 and the object 14. The engagement member 90 is also configured such that when the masking assembly 74 is placed on the object 14, the masking assembly 74 "self-centers" with respect to the object 14. Stated another way, the magnetic force acting between the mask base 82 and the first ferromagnetic members 34 tends to pull the masking assembly 74 into a substantially centered, substantially coaxial relationship with respect to the object 14. Because the object 14 also "self-centers" with respect to the support disk 38, when the support base 18, the object 14, and the masking assembly 74 are assembled with one another the components are substantially coaxially aligned along the central axis 26.

As mentioned, the central plate portion 86 of the exemplary mask base 82 may be formed of a ferromagnetic material that is attracted to the first ferromagnetic members 34. In the illustrated embodiment, the first ferromagnetic members 34 are permanent magnets and the mask base 82 is a ferromagnetic metal. In other embodiments, the mask base 82 may be or include one or more permanent magnets and the first ferromagnetic members 34 may be or include a ferromagnetic metal. In still other embodiments, both the mask base 82 and the first ferromagnetic members 34 may be or include permanent magnets. In still other embodiments, one or both of the mask base 82 and the first ferromagnetic members 34 may be or include electromagnets that can be turned on or off to activate or deactivate a magnetic field.

The masking assembly 74 also includes a mask guide 94 in the form of an elongated post that extends from the mask base 82. In the illustrated configuration the mask guide 94 is a single post that extends substantially linearly away from a central portion of the central plate portion 86 and defines a guide axis 96. In other configurations, a plurality of posts or other forms of guides may also or alternatively be provided. The illustrated mask guide 94 is a threaded rod that extends through the central plate portion 86. A stop member 98 the form of a stop nut is coupled to a distal end of the mask guide 94.

Figure 4:
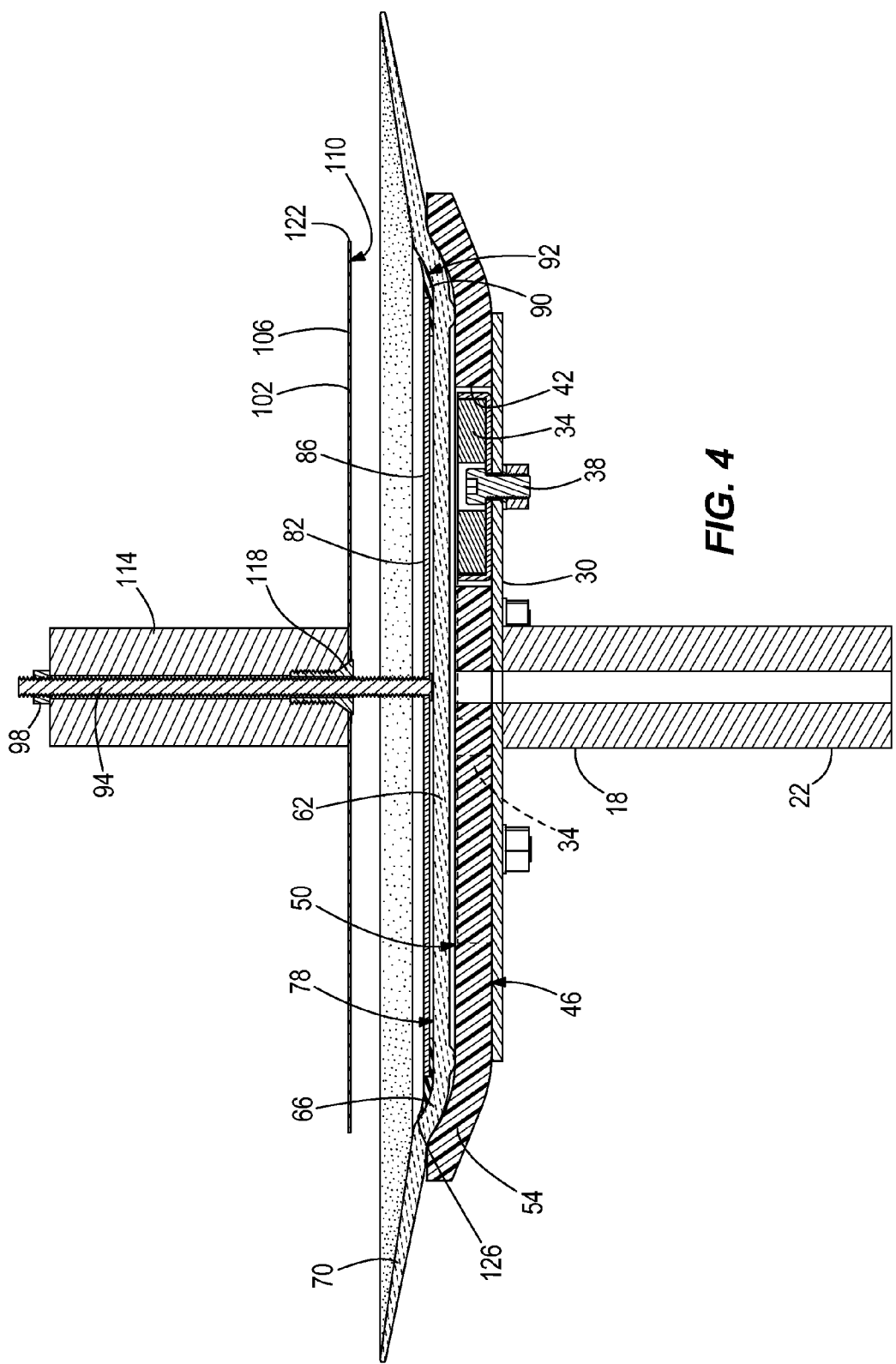
FIG. 4 is a section view similar to FIG. 3 with a masking member in a raised position.

Referring also to FIG. 4, a mask 102 is moveably coupled to the mask guide 94 for substantially linear movement between a lowered or engaged position, as shown in FIG. 3, and a raised or disengaged position as shown in FIG. 4. The mask 102 includes a masking portion 106 that defines a masking surface 110 configured for engagement with the upper contour 78 of the object 14, and a guide sleeve 114 coupled to the masking portion 106 and slidingly engaged with the mask guide 94. As shown in FIGS. 3 and 4, the masking portion 106 is coupled to the guide sleeve 114 by a hollow fastener 118, and the mask guide 94 extends through the hollow fastener 118 and through the guide sleeve 114. When the mask 102 is in the engaged position (FIG. 3), the masking surface 110 engages the upper contour 78 of the object 14 and covers the radially inner portions of the object. When the mask 102 is in the disengaged position (FIG. 4), the masking surface 110 is disengaged from the upper contour 78 of the object 14 and the guide sleeve 114 is engaged with the stop member 98 provided on the mask guide 94. The guide sleeve 114 also acts as a handle for positioning and removing the masking assembly 74 with respect to the object 14 and the support base 18.

The masking fixture 10 is thus configured to cover or mask a desired area of the object 14 during a coating operation. The mask 102 defines a masking profile 122, which in the illustrated embodiment is generally circular. When the mask 102 is in the lowered or engaged position, portions of the object 14 that are covered by the mask 102, e.g., that are obscured by the masking profile 122 will not be coated during a coating operation, such as a painting or powder coating operation. Thus, in the illustrated embodiment, central portion 62 and the transition portion 66 of the object 14 are covered by the mask and therefore remain uncoated, while the outer portion 70 remains exposed and receives the coating. It should be appreciated that the masking profile 122 may be any desired shape or configuration, and may be configured to include decorative patterns, stencils, and the like. The illustrated circular masking profile 122 has a greater diameter than a base perimeter 126 of the mask base 82, such that when the mask 102 is in the lowered or engaged position, the base perimeter 126 is inwardly offset from the masking profile 122, thereby preventing coating from collecting on the mask base 82.

In use, the object 14 may be positioned on the support surface 50 of the support disk 38. The lower contour 58 of the object 14 cooperates with the contour of the support surface 50 to self-center the object 14 with respect to the central axis 26. The masking assembly 74 is then moved into position above the object 14, for example by holding the guide sleeve 114. When the masking assembly 74 gets close enough to the central portion 62 of the object 14, the ferromagnetic central plate portion 86 comes under the influence of the magnetic force provided by the ferromagnetic members 34 and is drawn downwardly toward the object 14. The outer engagement member 90 of the mask base 82 engages the upper contour 78 of the object 14 and the magnetic force provided by the ferromagnetic members 34 pulls the mask base 82 downwardly against the object 14, thereby effectively clamping the object between the mask base 82 and the support disk 38. The contour of the lower engagement surface 92 cooperates with the upper contour 78 of the object to self-center the mask base 82 with respect to the object 14, which also substantially aligns the guide axis 96 with the central axis 26.

The mask 102 may then be moved to the lowered or engaged position such that the masking surface 110 engages the upper contour 78 of the object. A coating such as paint, powder coat, or the like may then be applied to the object 14, for example by spraying, brushing, or substantially any other method. The mask 102 functions to provide a well defined edge to the portions of the object 14 that are coated and those that are not. After the coating has been applied, the mask 102 is moved to the raised or disengaged position by moving the guide sleeve 114 axially along the mask guide 94. By limiting movement of the mask 102 in a direction that is substantially perpendicular to the upper contour 78 of the object, the mask 102 can be removed without disturbing the well defined border between the coated and the uncoated portions of the object 14, even though the coating may not be completely dried or cured. With the mask 102 in the raised position, upward and/or sideways forces may be applied to the guide sleeve 114 to overcome the magnetic attraction between the central plate portion 86 and the ferromagnetic members 34 and to thereby disengage the masking assembly 74 from the object 14. Because the base perimeter 126 is inwardly offset from the masking profile 122, small movement of the mask base 82 during removal will generally not disturb the previously applied coating. When removing the masking assembly 74, forces may be transferred from the guide sleeve 114 to the mask base 82 by way of the stop member 98 and/or the mask guide 94.

Thus, the masking fixture 10 is configured for use in connection with a method for applying a coating to the object 14, and can include positioning a first side of the object 14 on the support surface 50 on the support disk 38 of the support base 18. The support base 18 includes at least one ferromagnetic member 34 positioned adjacent the support surface 50. The mask base 82, which is magnetically attracted to the ferromagnetic member 34, is positioned against a second side of the object 14. The magnetic attraction between the ferromagnetic member 34 and the mask base 82 substantially clamps the object 14 between the support surface 50 and the mask base 82. The mask 102 is engaged with the second side of the object 14. The mask 102 is moveably mounted to the mask base 82 and includes the masking surface 110 that defines the masking profile 122. With the mask 102 engaged with the second side of the object 14, a coating is applied to the second side of the object 14. After applying the coating, the mask 102 is moved with respect to the mask base 82 to disengage the mask 102 from the second surface of the object 14. With the mask 102 disengaged from the second surface, a force is applied to at least one of the mask 102 and the mask base 82 to overcome the magnetic attraction between the ferromagnetic member 34 and the mask base 82 and to thereby disengage the mask base 82 from the second side of the object 14.

While the specific embodiments have been illustrated and described, numerous modifications come to mind without significantly departing from the spirit of the disclosure, and the scope of protection is only limited by the scope of the accompanying claims.

What is claimed is:

1. A method for applying a coating to dishware, the method comprising:
   positioning a first side of the dishware on a support surface of a support base, wherein the support surface has a concave and upwardly extending outer rim portion and the support base includes at least one ferromagnetic member positioned adjacent the support surface;
   positioning a mask base that is magnetically attracted to the ferromagnetic member against a second side of the dishware, the magnetic attraction between the ferromagnetic member and the mask base substantially clamping the dishware between the support surface and the mask base;
   engaging a mask with the second side of the dishware, the mask being moveably mounted to the mask base and including a masking surface that defines a masking profile;
   with the mask engaged with the second side of the dishware, applying the coating to the second side of the dishware;
   after applying the coating, moving the mask with respect to the mask base to disengage the mask from the second surface; and
   with the mask disengaged from the second surface, applying a force to at least one of the mask and the mask base to overcome the magnetic attraction between the ferromagnetic member and the mask base and to thereby disengage the mask base from the second side of the dishware.

2. The method of claim 1, wherein engaging the mask with the second side of the dishware includes moving the mask in a substantially linear direction.

3. The method of claim 1, wherein engaging the mask with the second side of the dishware includes positioning the mask to substantially overlie the mask base.

4. The method of claim 1, wherein positioning the mask base against the second side of the dishware includes engaging a non-ferromagnetic portion of the mask base against the second side of the dishware and thereby preventing contact between a ferromagnetic portion of the mask base and the second side of the dishware.

5. The method of claim 1, wherein applying the coating to the second side of the dishware includes rotating the support base, the dishware, the mask base, and the mask about a common rotational axis.

\* \* \* \* \*